United States Patent
Chang et al.

(10) Patent No.: US 10,170,351 B2
(45) Date of Patent: Jan. 1, 2019

(54) TRANSFERRING APPARATUS AND METHOD FOR MANUFACTURING AN INTEGRATED CIRCUIT DEVICE

(71) Applicant: Samsung Electronics Co., Ltd., Suwon-si (KR)

(72) Inventors: Min-Gu Chang, Anyang-si (KR); Sang-Hui Lee, Andong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/685,226

(22) Filed: Aug. 24, 2017

(65) Prior Publication Data

US 2018/0122672 A1  May 3, 2018

(30) Foreign Application Priority Data

Oct. 31, 2016  (KR) .................. 10-2016-0143076

(51) Int. Cl.
*H01L 21/677* (2006.01)

(52) U.S. Cl.
CPC .... *H01L 21/67742* (2013.01); *H01L 21/6773* (2013.01); *H01L 21/6776* (2013.01);
(Continued)

(58) Field of Classification Search
CPC ............ H01L 21/677; H01L 21/67733; H01L 21/67736; H01L 21/67706; H01L 21/67724; H01L 21/6773; H01L 21/67742; H01L 21/67745; H01L 21/6776; H01L 21/67723; G03F 7/70741
(Continued)

(56) References Cited

U.S. PATENT DOCUMENTS 6,435,330 B1 * 8/2002 Bonora ............ H01L 21/67706
                                                 198/346.1
6,612,785 B1   9/2003 Ouellette
(Continued)

FOREIGN PATENT DOCUMENTS

JP    19980278780 A2   10/1998
JP    20000269296 A2   9/2000
(Continued)

OTHER PUBLICATIONS

Office Action dated Nov. 21, 2017 from the Korean Intellectual Property Office (KIPO) for Korean Patent Application No. 10-2016-0143076.

*Primary Examiner* — Lan Vinh
(74) *Attorney, Agent, or Firm* — Muir Patent Law, PLLC

(57) ABSTRACT

In one embodiment a transferring apparatus comprises a rail connected to a frame, a travelling part including a wheel that travels along the rail and a loading part for loading an object, and a particle collection receptacle provided at a side of the rail and configured to collect particles generated due to friction between the wheel and the rail when the wheel travels along the rail. A method of manufacturing an integrated circuit device using the transferring apparatus includes moving the travelling part to the object, picking up the object with the loading part thereby loading the object on the loading part, using the travelling part to move the object to a chamber, and forming a semiconductor device using the object.

20 Claims, 3 Drawing Sheets

(52) U.S. Cl.
    CPC .. *H01L 21/67706* (2013.01); *H01L 21/67724* (2013.01); *H01L 21/67733* (2013.01); *H01L 21/67745* (2013.01)

(58) Field of Classification Search
    USPC ............... 216/41, 50, 58, 67; 438/782; 156/345.31, 345.32
    See application file for complete search history.

(56) References Cited

U.S. PATENT DOCUMENTS

| | | | |
|---|---|---|---|
| 6,875,282 B2 * | 4/2005 | Tanaka | G03F 1/66 118/719 |
| 7,735,638 B2 | 6/2010 | Hau et al. | |
| 7,798,309 B2 | 9/2010 | Rice et al. | |
| 2006/0278612 A1 * | 12/2006 | Tokunaga | H01L 21/02057 216/67 |
| 2013/0269564 A1 * | 10/2013 | Yoo | B66C 7/02 104/91 |

FOREIGN PATENT DOCUMENTS

| | | |
|---|---|---|
| KR | 20-0415595 | 5/2006 |
| KR | 10-0687008 | 2/2007 |
| KR | 10-2009-0038093 | 4/2009 |
| KR | 10-2011-0101357 | 9/2011 |
| KR | 10-2012-0007415 | 1/2012 |
| KR | 10-1374665 | 3/2014 |
| KR | 10-1407414 | 6/2014 |

\* cited by examiner

TRANSFERRING APPARATUS AND METHOD FOR MANUFACTURING AN INTEGRATED CIRCUIT DEVICE

PRIORITY STATEMENT

This application claims priority under 35 U.S.C. § 119 to Korean Patent Application No. 10-2016-0143076, filed on Oct. 31, 2016 in the Korean Intellectual Property Office (KIPO), the contents of which are herein incorporated by reference in their entirety.

BACKGROUND

1. Field

Example embodiments relate to a transferring apparatus and method for manufacturing an integrated circuit device. More particularly, example embodiments relate to a transferring apparatus such as an overhead hoist transfer in use of transferring an object such as a mask during manufacturing an integrated circuit device such as a flat panel display.

2. Description of the Related Art

In manufacturing of an integrated circuit device such as a semiconductor device, a flat panel display, etc., a transferring process may be performed to transfer an object such as a mask required for manufacturing the integrated circuit device.

Recently, an overhead hoist transfer (OHT) may be used for the transferring apparatus in manufacturing of the integrated circuit device. The OHT may be disposed in a ceiling of a clean room in a manufacturing line of the integrated circuit device.

In particular, the transferring apparatus used for manufacturing an integrated circuit device may include a rail provided in the ceiling of the manufacturing line and a wheel travelling along the rail.

Here, particles may be generated due to friction between the wheel and the rail when the wheel travels along the rail.

Accordingly, in the transferring process using the conventional transferring apparatus for manufacturing an integrated circuit device, process reliability may be deteriorated due to the generated particles.

SUMMARY

Example embodiments provide a transferring apparatus and method for manufacturing an integrated circuit device capable of minimizing occurrence of particles while travelling along a rail.

In one embodiment a transferring apparatus comprises a rail connected to a frame, a travelling part including a wheel that travels along the rail and a loading part for loading an object, and a particle collection receptacle provided at a side of the rail and configured to collect particles generated due to friction between the wheel and the rail when the wheel travels along the rail. A method of manufacturing an integrated circuit device using the transferring apparatus includes moving the travelling part to the object, picking up the object with the loading part thereby loading the object on the loading part, using the travelling part to move the object to a chamber, and forming a semiconductor device using the object.

In one embodiment, a transferring apparatus, a rail connected to a frame, a travelling part including a wheel that travels along the rail and a loading part for loading an object, and a particle collecting part, provided at a side of the rail, for collecting particles generated due to friction between the wheel and the rail when the wheel travels along the rail. A method of manufacturing an integrated circuit device using the transferring apparatus includes moving the travelling part to the object, picking up the object with the loading part thereby loading the object on the loading part, using the travelling part to move the object to a chamber, collecting particles in the particle collecting part, and forming a semiconductor device using the object.

In one embodiment, a transferring apparatus includes a rail connected to a frame, a transport vehicle including a wheel that travels along the rail, the transport vehicle used to move an object, and a particle collection receptacle provided at a side of the rail and configured to collect particles generated due to friction between the wheel and the rail when the wheel travels along the rail. A method of manufacturing an integrated circuit device includes moving the transport vehicle toward the object, picking up the objet, using the transport vehicle to move the object to a chamber, collecting particles in the particle collection receptacle, performing a process on a wafer in the chamber using the object, and forming the integrated circuit device from the processed wafer.

Accordingly, the particles generated due to the friction between the wheels and the rail may be collected stably and easily to thereby improve process reliability and competitive strength of products.

BRIEF DESCRIPTION OF THE DRAWINGS

Example embodiments will be more clearly understood from the following detailed description taken in conjunction with the accompanying drawings.

FIG. 1 is a view illustrating a transferring apparatus used for manufacturing an integrated circuit device in accordance with example embodiments.

FIG. 2 is a perspective view illustrating a rail and a particle collecting part of the transferring apparatus in FIG. 1 in accordance with example embodiments.

FIG. 3 depicts a method of manufacturing an integrated circuit device using a transferring apparatus, in accordance with example embodiments.

DETAILED DESCRIPTION

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Figure 1:
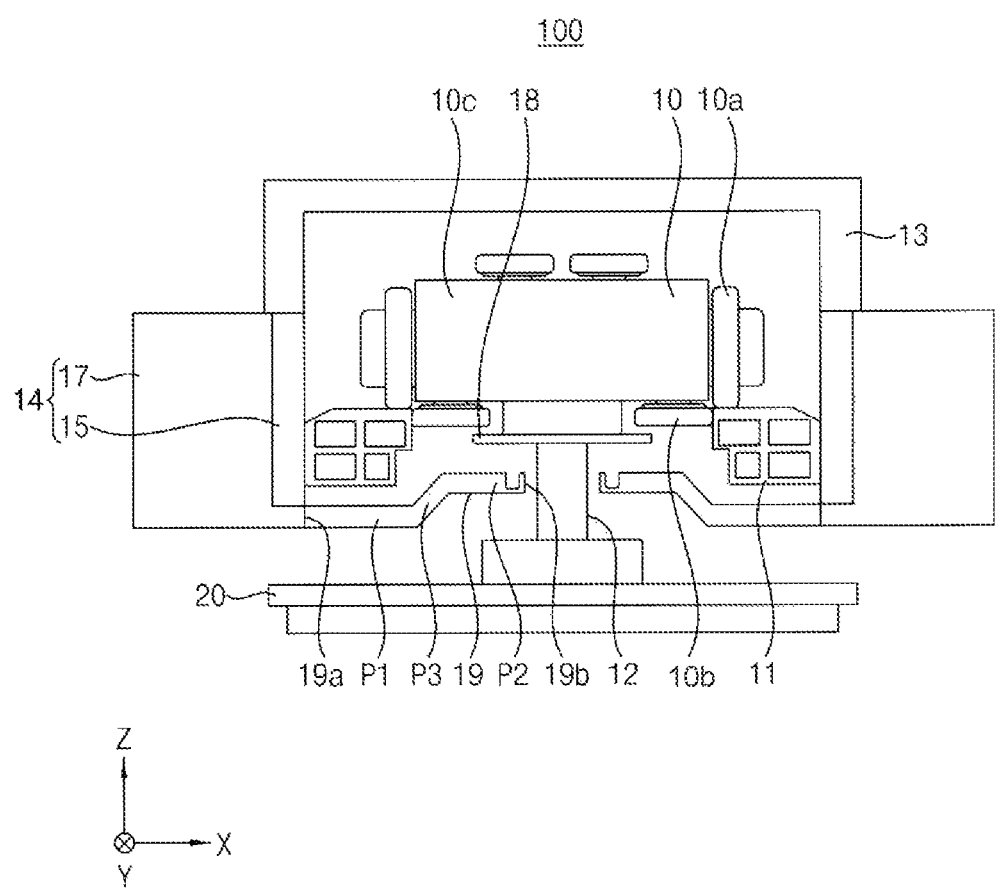
FIGS. 1 to 3 represent non-limiting, example embodiments as described herein.
Figure 2:
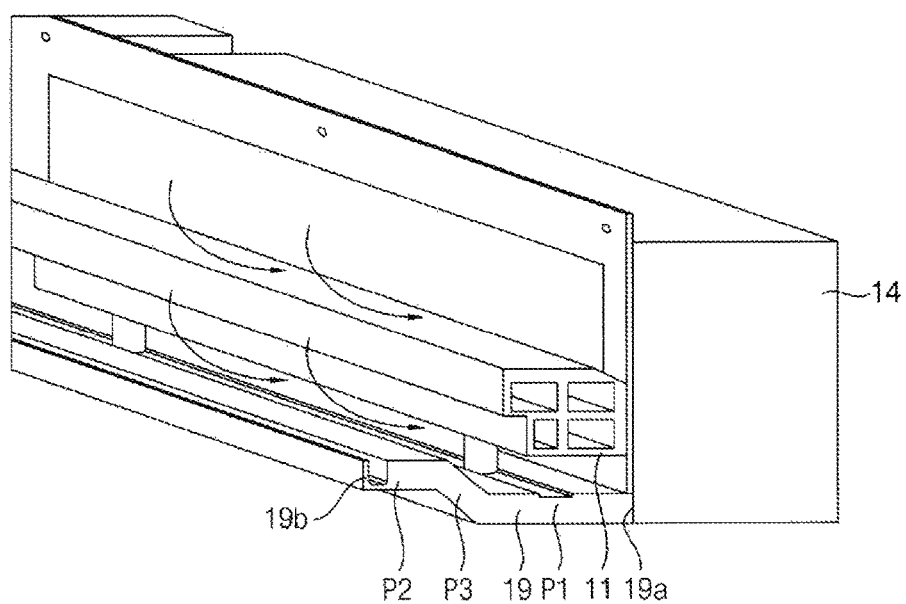

FIG. 1 is a view illustrating a transferring apparatus used for manufacturing an integrated circuit device in accordance with example embodiments. FIG. 2 is a perspective view illustrating a rail and a particle collecting part of the transferring apparatus in FIG. 1 in accordance with example embodiments.

Referring to FIGS. 1 and 2, a transferring apparatus 100 used for manufacturing an integrated circuit device may be an overhead hoist transfer (OHT), and may include a travelling part 10 having wheels 10a and configured to transfer an object along a rail 11, a loading part 20 connected to the travelling part 10 and configured to grip the object and move upward and downward, and an adjusting part 12 disposed between the travelling part 10 and the loading part 20 and configured to adjust a position of the object while the travelling part 10 travels, and a fall prevention part (not illustrated) configured to maintain the holding of the object during travelling and prevent the object from falling down.

As discussed herein, an integrated circuit device may refer to a semiconductor device, a flat panel display, or other electronic device being manufactured. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. An integrated circuit device may include, for example, a substrate having an integrated circuit thereon, such as a wafer, or a plurality of semiconductor devices formed in an array on a wafer.

An electronic device, as used herein, may refer to these semiconductor devices or integrated circuit devices, and may additionally include products that include these devices, such as a memory module, memory card, hard drive including additional components, or a mobile phone, laptop, tablet, desktop, camera, or other consumer electronic device, etc.

The travelling part 10 may travel along the rail 11 and transfer the object. The travelling part 10 may move on the rail 11 connected to and supported on a frame 13 installed, for example on a ceiling of a manufacturing line of the integrated circuit device, the wheels 10a travelling along the rail 11, a body supporting the wheels 10a, a driving motor for driving the wheels 10a, etc. Additional wheels 10b may be used as well, for example for stabilization purposes. In one embodiment, wheels 10a may be powered by a motor, which may be controlled by a control system including one or more computers and other hardware and software equipment. Other mechanisms may be used instead of or in addition to a such a motor in order to move the travelling part 10 along the rails. Wheels 10a may be positioned to have a radial axis extending in a horizontal direction, and may roll along a top surface of the rail 11 (top surface facing the ceiling, and being a horizontal plane, for example). Wheels 10b may be positioned to have a radial axis extending in a vertical direction, and may roll along a side (e.g., vertical plane) surface. Both sets of wheels 10a and 10b may contact and roll along the surfaces of the rail at the same time, to maintain stability and a close connection. Though two of each type of wheels are shown in the cross-sectional view of FIG. 1, typically at least two pairs of first wheels 10a are used, and two or more pairs of second wheels 10b may be used as well.

The travelling part 10 may refer to just the portion of the transferring apparatus 100 that includes the wheels and a unit (e.g., a box or physical block) connected to the wheels that supports the portions 18, 12, and 20 described further below. This portion may also be referred to as a transport vehicle, which may have the portions 18, 12, and 20 connected to it. The term "travelling part" may also be used to describe the entire movable unit including the wheels 10a and 10b, the unit 10c, as well as portions 18, 12, and 20.

The loading part 20 may be connected to the travelling part 10 (e.g., the transport vehicle) and grip and move the object upward and downward. The loading part 20 may be connected to a lower portion of the travelling part 10. The loading part 20 may include a hand gripper (not illustrated) for gripping the object, a hoist (not illustrated) for moving the object upward and downward, or other known components for holding and moving an object, such as a mask.

The adjusting part 12 may be disposed between the travelling part 10 (e.g., the transport vehicle) and the loading part 20 and may adjust the position of the object. For example, the adjusting part 12 may include a slider, a rotator, etc., for moving the object in a direction in a horizontal plane. For example, the slider may be mounted on a lower surface of the travelling part, and the rotator may be mounted on a lower surface of the slider. Both the slider and the rotator may include one or more motors or actuators connected to different components (e.g., plates, blocks, etc.) so that the components can move in relation to each other in order to rotate, slide, or otherwise move the loading part 20.

The fall prevention part may be mounted on the hand gripper and may include a contact part for gripping the object such as a magazine, a driving part for the contact part, etc.

The transferring apparatus 100 according to example embodiments may include a particle collecting part 14.

The particle collecting part 14 may collect particles generated due to friction between the wheel and the rail when the travelling part travels along the rail 11. The particle collecting part 14 may be provided at a side of the rail 11. The particle collection part 14 may be, for example, a particle collection receptacle or container. When two rails 11 are arranged to be opposite to each other, the particle collecting parts 14 may be provided on opposite sides of the rails 11.

The particle collecting part 14 may include a partition wall 15 disposed at the side of the rail 11 and a fan filter unit (FFU) 17 adjacent to the partition wall 15. The partition wall 15 may be connected to the frame 13 and the rail 11. When the particles are generated due the friction between the wheel and the rail, the particles may be collected in the fan filter unit 17 through the partition wall 15. In one embodiment, there may be an opening in the partition wall 15 both below and above the rail 11, so that particles falling both above and below the rail can be collected in the fan filter unit 17. The fan filter unit 17 may include, for example, a hollow compartment where particles can be collected (e.g., a particle collection compartment), the hollow compartment formed by surrounding sidewalls, and top cover and a bottom floor. The fan filter unit 17 may also include other components, such as filter, a fan to create a suction air flow, or a membrane, adhesive, or other device disposed to prevent particles from escaping the hollow compartment.

Even though particles are generated during a transfer process using the transferring apparatus 100, the particles may be collected using the particle collecting part 14, thereby minimizing adverse effects due to the particles.

The transferring apparatus 100 may further include a cable securing part 19. For example, the cable securing part 19 may include a Litz wire support disposed under the rail 11 to secure a cable. The cable securing part 19 may become curved downward toward the side of the rail 11. That is, as the cable securing part 19 gets closer to the particle collecting part 14, the cable securing part 19 may be bent more downward.

In addition, the cable securing part 19 may be spaced apart from the rail 11 to form a space. For example, the cable securing part 19 may be arranged under the rail 11 to form a path through which air flows into the particle collecting part 14.

In greater detail, a cable securing part 19 may be formed adjacent to and attached to each fan filter unit 17. Taking one cable securing part 19 as an example, the cable securing part 19, also described more generally as a lower encasement, or tray (e.g., lower or bottom tray), may extend along the length of the rail 11 (e.g., in a first, Y-direction), and may be disposed below the rail. The cable securing part 19 may extend to and connect at a first end 19a to the particle collection part (e.g., as shown in FIG. 2 without any gap therebetween), and may extend at a second, opposite end 19b, to a location toward a center of the transferring apparatus, to fully overlap and extend in a second, X-direction (perpendicular to the first direction) beyond a region where wheels that engage with the rail 11 are disposed. In one embodiment, the lower encasement 19 has a first portion P1 adjacent to and closest to the fan filter unit 17 at a first height, a second portion P2 furthest from the fan filter unit 17 at a second height (e.g., heights being defined in a third, Z-direction perpendicular to the first direction and the second direction), and a third portion P3 between the first portion P1 and second portion P1 that connects the first portion P1 to the second portion P2 and is at a height between the first height and the second height.

For example, the first portion P1 may be a horizontal portion, and the second portion P2 may be a horizontal portion, and the third portion P3 may extend at an angle to the horizontal (e.g., diagonally, or both vertically and horizontally) between the first portion P1 and second portion P2. The lower encasement 19 may have an angled shape as shown in FIG. 2, but is not limited as such, and may have a curved shape in order to have a second portion (e.g., P2) higher than a first portion (e.g. P1). As a whole, the lower encasement 19 may be slanted in a downward manner when traversing from the second end 19b toward the first end 19a. By having this orientation, particles arriving at the lower encasement 19 will naturally flow toward the particle collecting part 14, and will avoid passing through to the object loaded on the loading part 20. In addition, as shown in FIG. 1, the lower encasement 19 may extend to be closer to the center of the travelling part than the rail, wheels, or other components where particles may be generated during movement. The lower encasement 19 may overhang the rail and wheels toward a center of the travelling part 10, and may also extend beyond an edge of a platform 18 included in the travelling part 10 just below the wheels 10b. In this manner, the lower encasement 19 may vertically overlap any opening above it where particles are formed from movement of the wheels 10a and 10b, to prevent those particles from passing to the loading part 20 and the object loaded on the loading part 20.

As mentioned above, in the transferring apparatus 100 according to example embodiments, the partition wall 15 and the fan filter unit 17 of the particle collecting part 14 may be arranged sequentially in the side of the rail 11, and the cable securing part 19 may have a slanted shape toward the rail 11. Accordingly, particle may flow through the space between the rail 11 and the cable securing part 19 and then may be collected into the fan filter unit 17.

In some example embodiments, a portion of the rail 11 may have a slanted shape in the direction from a center of the transferring apparatus 100 toward the partition wall 15. For example, an inner, upper surface of the rail 11 that contacts the wheel may have a flat, horizontal surface at a first height, and an outer upper surface of the rail 11 may have a slanted surface toward the particle collecting part 14.

Thus, according to the embodiments shown in FIGS. 1 and 2, since the cable securing part 19 as well as the rail 11 has a slanted shape higher toward the center of the transferring apparatus 100 than at the particle collecting part 14, a down-flow of air from the ceiling to a floor may flow along the path between the rail 11 and the cable securing part 19 toward the particle collecting part 14, rather than toward the object loaded on the loading part 20, thereby easily collecting the particles.

In some embodiments, the manufacturing line including the transferring apparatus 100 installed therein, the down-flow air may flow from the ceiling to the floor. The air may also flow by including additional fan or air flow components that cause air to flow toward the fan filter unit 17 (e.g., such components may be included in the fan filter unit 17). Accordingly, the down-flow air may be guided to flow under the rail 11 using the slanted shape of the cable securing part 19, thereby directing the particles to the side of the rail. The particle collecting part 14 may be provided at the side of the rail 11 to easily collect particles generated due to friction between the wheel and the rail when the travelling part travels along the rail 11.

Further, in some embodiments, since the air flows through the path formed between the rail 11 and the cable securing part 19, the air above the rail 11 and the cable securing part 19 may be suctioned (e.g., through the use of suction fans in the fan filter unit 17), and thus, the particles may be prevented from being dispersed during collecting of the particles.

Thus, the transferring apparatus 100 in use of manufacturing the integrated circuit device may include the particle collecting part 14 provided at the side of the rail 11 to collect particles generated due to friction between the wheel and the rail, and the rail 11 and the cable securing part 19 may form a slanted, downward sloping path between the rail and the cable securing part such that an air is directed to flow toward the particle collecting part 14 in the side of the rail 11, thereby easily collecting the particles.

Accordingly, the particles generated due to the friction between the wheels and the rail may be collected stably and easily to thereby improve process reliability and competitive strength of an end product.

Figure 3:
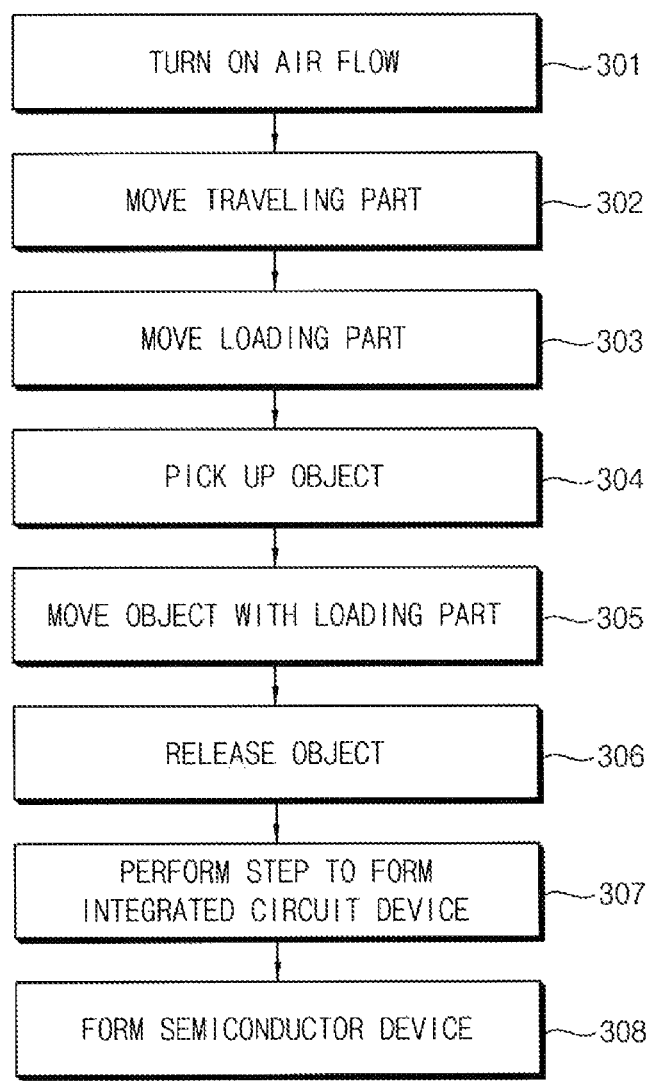

In use, the transferring apparatus may transfer an object used in manufacturing an integrated circuit device in the following manner, as shown in FIG. 3. First, in step 301, an air flow system may be turned on. For example, such an air flow system could include a building air flow system, such as a system built into the ceiling, floor, and/or walls of a room that houses the transferring apparatus. In addition, or alternatively, the air flow system could include suction elements (e.g., fans) installed in the fan filter unit 17 of the transferring apparatus, or other air flow equipment.

In step 302, the travelling part 10 (which may include, for example, a transport vehicle) may be moved to a location where an object used for manufacturing is located. The travelling part 10 may move along the rails 11 to be positioned near the object. For example, the object can be a mask used in a lithography process in manufacturing an integrated circuit device. Next, in step 303, the loading part 20 may be moved, for example, using an electro-mechanical device connected to a holder such as a hand-gripper, in a manner that allows the object to be picked up. In step 304, the object is picked up and held by the loading part 20. In step 305, the object and loading part 20 are moved by the travelling part 10 moving along the rails 11, in order to move the object to a different location. The object may then be moved and released by the loading part 20 (step 306), into equipment that uses the object, for example, that uses a mask for photolithography. During the travelling process, the particle collection part 14 may collect particles generated as a result of the travelling, and the lower encasement 19 and slanted shape of the rail 11 may prevent particles from reaching the object. For example, the lower encasement 19 may form a channel with the bottom of the rail 11, where a space is formed between the bottom of the rail 11 and the lower encasement 19. The lower encasement may therefore, due to its shape, direct particles toward the particle collection receptacle.

Next, in step 307, the object may be used to perform a step in forming an integrated circuit device such as a semiconductor wafer. For example, the mask may be placed in a chamber where a semiconductor wafer is disposed, and may be used for a photolithography process to form a pattern on the semiconductor wafer. Subsequently, additional steps may be performed on the wafer, for example to form a semiconductor device (step 308). For example, additional layers may be deposited on the wafer to form semiconductor chips, the semiconductor chips may then be singulated, packaged on a package substrate, and encapsulated by an encapsulant to form a semiconductor device.

The above steps may be controlled by a control system including one or more computers and one or more electro-mechanical devices for moving a travelling part within a transferring apparatus. Also, though the above steps are described in a particular order, they need not occur in that order necessarily. As one example, the travelling part 10 may be moved prior to the air flow system being turned on.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method of manufacturing an integrated circuit device using a transferring apparatus,
    wherein the transferring apparatus comprises:
        a rail connected to a frame;
        a travelling part including a wheel that travels along the rail and a loading part below the rail for loading an object below the rail; and
        a particle collection receptacle provided at a side of the rail and configured to collect particles generated due to friction between the wheel and the rail when the wheel travels along the rail, the method including:
    moving the travelling part to the object;
    picking up the object with the loading part thereby loading the object on the loading part;
    using the travelling part to move the object to a chamber; and
    forming a semiconductor device using the object.

2. The method of claim 1, wherein the object is a mask, and further comprising:
    performing a photolithography process using the mask when the mask is in the chamber, to form a pattern of the semiconductor device.

3. The method of claim 1, wherein the particle collection receptacle includes:
    a partition wall disposed at the side of the rail; and
    a particle collection compartment adjacent to the partition wall.

4. The method of claim 3, wherein the particle collection compartment is a fan filter unit.

5. The method of claim 1, wherein a first portion of an upper surface of the rail contacts the wheel and has a flat surface and a second portion of the upper surface of the rail has a slanted surface sloping downward toward the particle collection receptacle.

6. The method of claim 1, further comprising a lower encasement disposed under the rail, the lower encasement extending in a first direction along the rail, and disposed to have a first end in a second direction adjacent to the particle collection receptacle and a second end opposite the first end in the second direction, wherein the second end is at a higher height than the first end.

7. The method of claim 6, wherein the lower encasement is slanted in a downward direction to be higher at the second end than at the first end.

8. The method of claim 6, further comprising:
    collecting the particles using the lower encasement to direct the particles toward the particle collection receptacle.

9. The method of claim 6, wherein the lower encasement is shaped and positioned to prevent particles from the travelling part above the lower encasement from reaching the object loaded on the loading part, which is below the lower encasement.

10. The method of claim 9, wherein the second end of the lower encasement vertically overlaps and extends beyond a portion of the travelling part where the wheel travels along the rail.

11. The method of claim 1, wherein the particle collection receptacle is spaced apart from the rail to form a space between the rail and the particle collection receptacle.

12. The method of claim 11, wherein air flowing through the transferring apparatus pushes the particles through the space toward the particle collection receptacle.

13. A method of manufacturing an integrated circuit device using a transferring apparatus,
wherein the transferring apparatus comprises:
a rail connected to a frame;
a travelling part including a wheel that travels along the rail and a loading part for loading an object; and
a particle collecting part, provided at a side of the rail, for collecting particles generated due to friction between the wheel and the rail when the wheel travels along the rail, the method including:
moving the travelling part to the object;
picking up the object with the loading part thereby loading the object on the loading part;
using the travelling part to move the object to a chamber;
collecting particles in the particle collecting part; and
forming a semiconductor device using the object.

14. The method of claim 13, further comprising:
a lower encasement below the rail and the wheel; and
a space between the rail and the lower encasement that forms a channel.

15. The method of claim 14, wherein air flowing through the transferring apparatus pushes the particles through the space toward the particle collecting part.

16. The method of claim 15, wherein the particle collecting part is a particle collection receptacle including sidewalls, a top cover, a bottom floor, and a compartment formed by the sidewalls, top cover, and bottom floor.

17. The method of claim 14, wherein the lower encasement has a downward slope in a direction from a middle of the transferring apparatus toward the rail.

18. The method of claim 13, wherein the rail includes a portion at a top surface of the rail that is slanted downward in a direction from an inside of the rail toward the particle collection part.

19. The method of claim 13, wherein the particle collecting part includes a particle collection compartment and a partition wall next to the rail, through which the particles travel to reach the particle collection compartment.

20. A method of manufacturing an integrated circuit device using a transferring apparatus,
wherein the transferring apparatus comprises:
a rail connected to a frame; and
a transport vehicle including a wheel that travels along the rail, the transport vehicle used to move an object;
a particle collection receptacle provided at a side of the rail and configured to collect particles generated due to friction between the wheel and the rail and that fall below the rail when the wheel travels along the rail, the method including:
moving the transport vehicle toward the object;
picking up the object;
using the transport vehicle to move the object to a chamber;
collecting particles in the particle collection receptacle;
performing a process on a wafer in the chamber using the object; and
forming the integrated circuit device from the processed wafer.

* * * * *